(12) United States Patent
King (10) Patent No.: US 6,423,611 B1
(45) Date of Patent: Jul. 23, 2002

(54) MANUFACTURING PROCESS OF CAPACITOR

(75) Inventor: Wei-Shang King, Hsinchu (TW)

(73) Assignee: Mosel Vitelic Inc. (TW)

( * ) Notice: Subject to any disclaimer, the term of this patent is extended or adjusted under 35 U.S.C. 154(b) by 0 days.

(21) Appl. No.: 09/556,903

(22) Filed: Apr. 20, 2000

Related U.S. Application Data (63) Continuation-in-part of application No. 09/118,334, filed on Jul. 16, 1998, now abandoned.

(30) Foreign Application Priority Data

Feb. 27, 1998 (TW) ........................................ 87102934 A (51) Int. Cl.$^7$ ............................................... H01L 21/20
(52) U.S. Cl. ........................................ 438/398; 438/255
(58) Field of Search ............................. 438/3, 240, 253, 438/254, 255, 396, 397, 398, 256, 399

(56) References Cited

U.S. PATENT DOCUMENTS

| | | | |
|---|---|---|---|
| 5,137,842 A | | 8/1992 | Chan et al. ............... 438/397 |
| 5,721,153 A | | 2/1998 | Kim et al. ................ 438/964 |
| 5,736,449 A | | 4/1998 | Miki et al. ............... 438/396 |
| 6,037,624 A | * | 3/2000 | King ....................... 257/296 |
| 6,117,727 A | * | 9/2000 | King ....................... 438/254 |
| 6,124,162 A | * | 9/2000 | Tu et al. .................. 438/253 |
| 6,153,462 A | * | 11/2000 | King ....................... 438/253 |
| 6,235,604 B1 | * | 5/2001 | King ....................... 438/255 |

* cited by examiner

*Primary Examiner*—Tuan H. Nguyen
(74) *Attorney, Agent, or Firm*—Skjerven Morrill LLP (57) ABSTRACT

A method for manufacturing a capacitor includes the steps of a) forming a sacrificial layer over the etching stop layer, b) partially removing the sacrificial layer, the etching stop layer, and the dielectric layer to form a contact window, c) forming a first conducting layer over the sacrificial layer and in the contact window, d) partially removing the first conducting layer and the sacrificial layer to expose a portion of the sacrificial layer and retain a portion of the first conducting layer, e) forming a second conducting layer over tops and sidewalls of the portion of the first conducting layer and the portion of the sacrificial layer, f) forming an intermediate layer on the second conducting layer, and g) removing the intermediate layer and partially removing the second conducting layer while retaining a portion of the second conducting layer with a rough top surface alongside the portion of the first conducting layer and the portion of the sacrificial layer, and removing the portion of the sacrificial layer to expose the etching stop layer and construct a capacitor plate with a generally reversed cylindrical structure having a rough top surface.

22 Claims, 8 Drawing Sheets

MANUFACTURING PROCESS OF CAPACITOR

The present invention is a continuation-in-part application of the parent application bearing Ser. No. 09/118,334 and filed on Jul. 16, 1998 now abandoned.

FIELD OF THE INVENTION

The present invention is related to a structure and a manufacturing method of a capacitor, and especially to a structure and a manufacturing method of a capacitor applied to the dynamic random access memory (DRAM).

BACKGROUND OF THE INVENTION

It is well known that the capacity of a capacitor is related to the quality of dynamic random access memory (DRAM). Therefore, many methods have been developed for increasing the capacity of a capacitor.

Figure 1A:
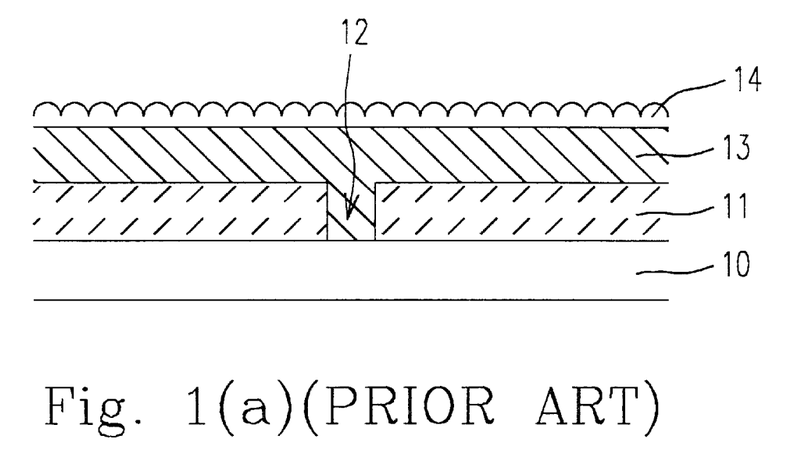
FIGS. 1(a) and (b) are schematic diagrams showing the first method for manufacturing a capacitor according to the prior art.
Figure 1B:
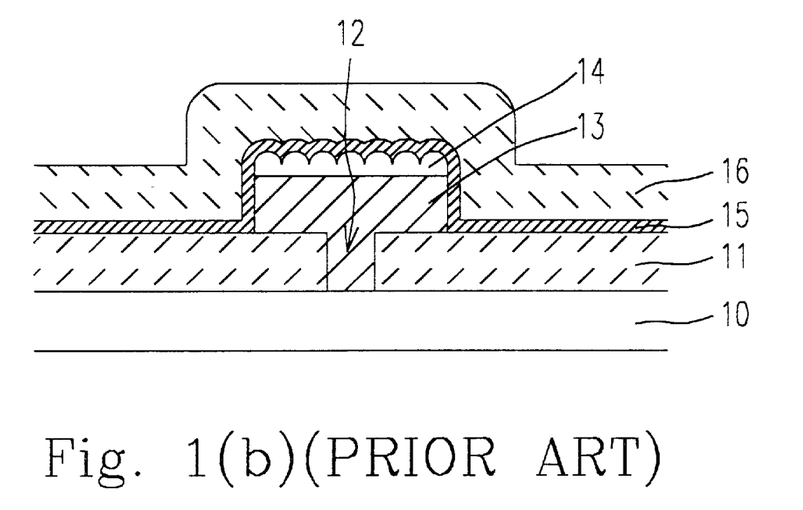

First of all, please refer to FIGS. 1(a) and (b) showing a conventional method for manufacturing a capacitor. This method is described in detail as follows.

Shown in FIG. 1(a) includes the steps of (1) forming an interlayer dielectric (ILD) 11 over a silicon substrate 10 by chemical vapor deposition (CVD) or lower pressure chemical vapor deposition (LPCVD), (2) defining a contact window by photolithography and partially removing the ILD 11 to form the contact window 12, (3) forming a doped polysilicon layer 13 with a thickness of 1000 Å over the ILD 11 and in the contact window 12 by LPCVD, and (4) forming a rugged polysilicon layer 14 with a thickness of 850 Å over the doped polysilicon layer 13 to increase the surface area of the capacitor.

In FIG. 1(b), the steps include: (1) defining the capacitor region by photolithography and partially etching the rugged polysilicon layer 14 and the doped polysilicon layer 13 to expose a portion of the ILD 11; (2) forming an oxide-on-nitride-on-oxide (ONO) layer 15 on the rugged polysilicon layer 14 and the ILD 11 and alongside the doped polysilicon layer 13 by LPCVD; and (3) forming another doped polysilicon layer 16 over the ONO layer 15 to construct the conventional capacitor.

Figure 2A:
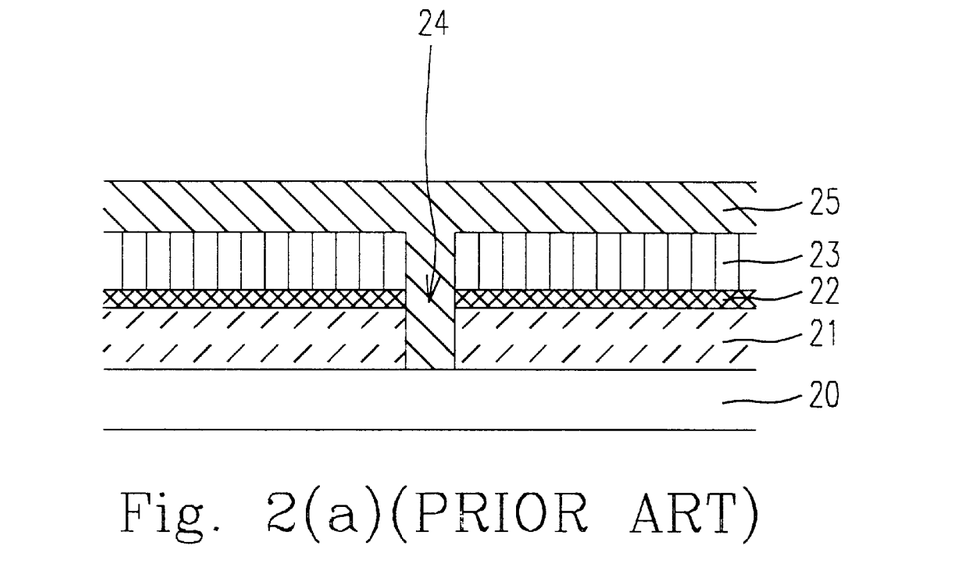
FIGS. 2(a) and (b) are schematic diagrams showing the second method for manufacturing a capacitor according to the prior art.
Figure 2B:
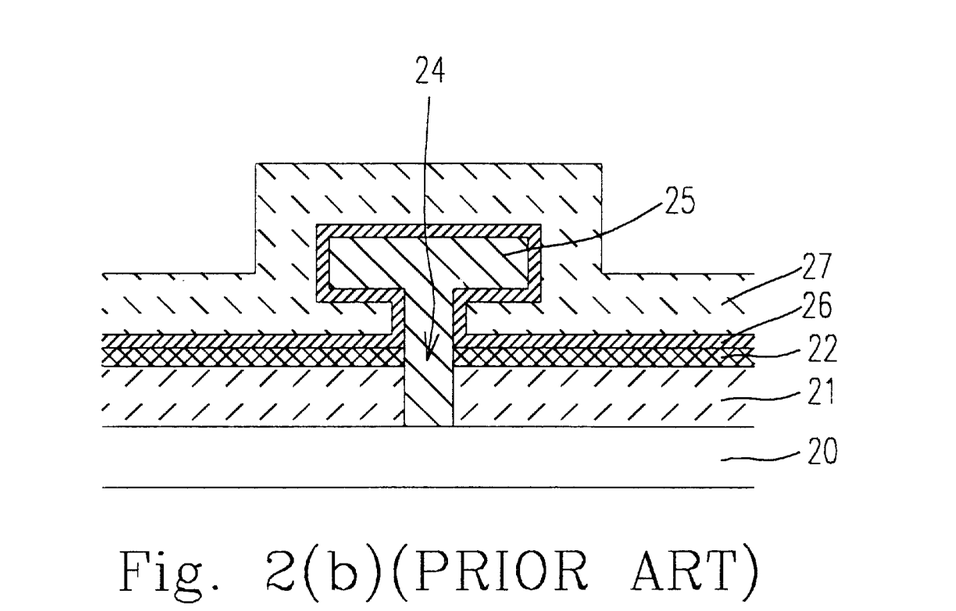

Please refer to FIG. 2 showing another conventional method. The detailed steps are illustrated as follows.

In FIG. 2(a), the steps include: (1) forming an interlayer dielectric (ILD) 21 over a silicon substrate 20 by chemical vapor deposition (CVD), (2) forming a silicon nitride 22 on ILD 21, wherein the silicon nitride 22 has a thickness of 100 Å~300 Å and serves as an etching stop layer, (3) forming a sacrificial oxide 23 on the silicon nitride 22 by CVD, (4) defining a contact window by photolithography and partially removing the ILD 21, the silicon nitride 22, and the sacrificial oxide 23 to form the contact window 24, and (5) forming a doped polysilicon layer 25 with a thickness of 1000 Å over the sacrificial oxide 23 and in the contact window 24 by LPCVD.

In FIG. 2(b), the steps include: (1) defining the capacitor region by photolithography and partially etching the doped polysilicon layer 25; (2) etching the sacrificial oxide 23 by using a buffer oxide etchant (B.O.E.) containing hydrofluoric acid (HF) to expose the silicon nitride 22; (3) forming an oxide-on-nitride-on-oxide (ONO) layer 26 on the silicon nitride 22 and a top and sidewalls of the doped polysilicon layer 25 by LPCVD; and (4) forming another doped polysilicon layer 27 on the ONO layer 26 to construct the capacitor.

In addition, there is another method as shown in FIG. 3. This method is described as follows.

Figure 3A:
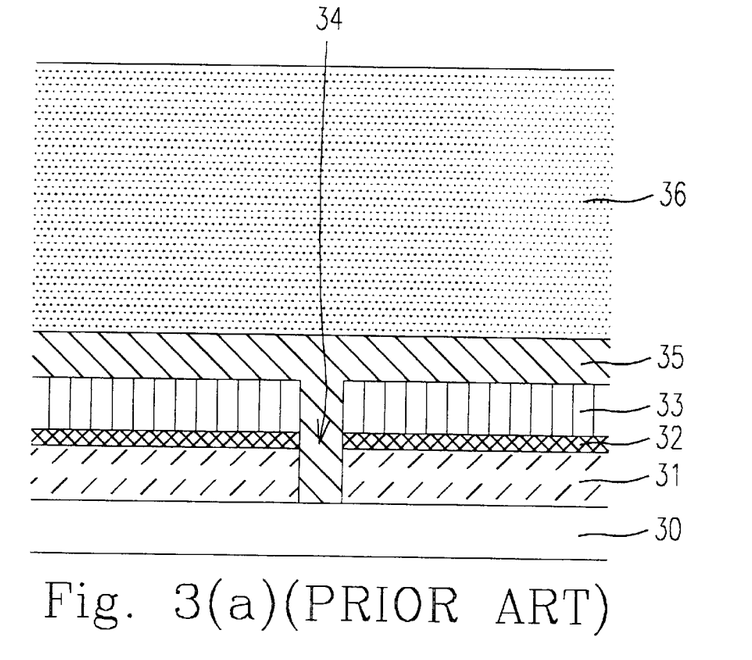
FIGS. 3(a)~(d) are schematic diagrams showing the third method for manufacturing a capacitor according to the prior art.

In FIG. 3(a), the steps include: (1) forming an interlayer dielectric (ILD) 31 over a silicon substrate 30 by CVD, (2) forming a silicon nitride 32 on ILD 31, wherein the silicon nitride 32 has a thickness of 100 Å~300 Å and serves as an etching stop layer, (3) forming a first sacrificial oxide 33 on the silicon nitride 32 by CVD, (4) defining a contact window by photolithography and partially removing the first sacrificial oxide 33, the silicon nitride 32, and the ILD 31 to form the contact window 34, (5) forming a first doped polysilicon layer 35 with a thickness of 1000 Å over the first sacrificial oxide 33 and in the contact window 34 by LPCVD, and (6) forming a second sacrificial oxide 36 on the first doped polysilicon layer 35 by CVD.

Figure 3B:
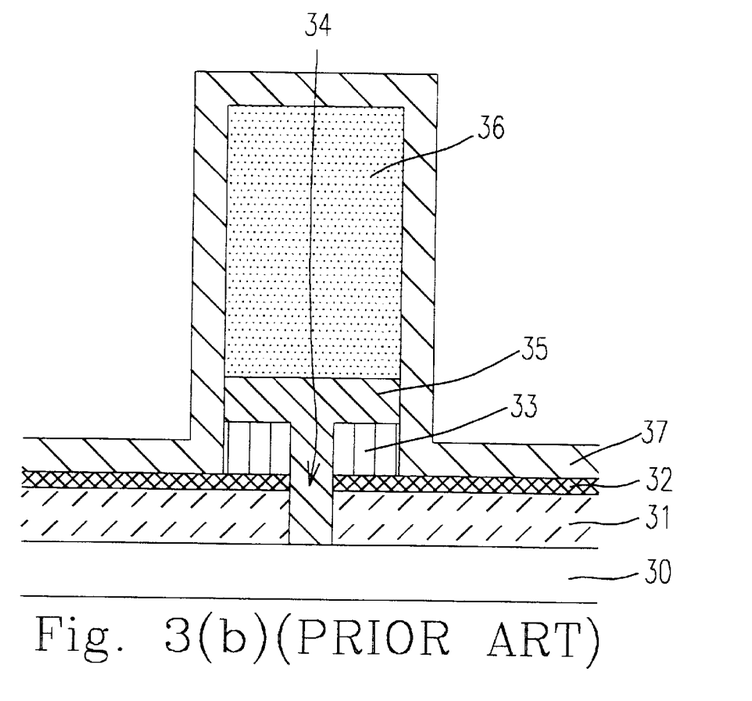

In FIG. 3(b), the steps include: (1) defining the capacitor region by photolithography and partially etching the second sacrificial oxide 36, the first doped polysilicon layer 35, and the first sacrificial oxide 33, wherein the silicon nitride 32 serves as an etching stop layer; (2) forming a second doped polysilicon layer 37 on the top surface of the second sacrificial oxide 36, alongside the second sacrificial oxide 36, the first doped polysilicon layer 35, and the first sacrificial oxide 33, as well as on the silicon nitride 32.

Figure 3C:
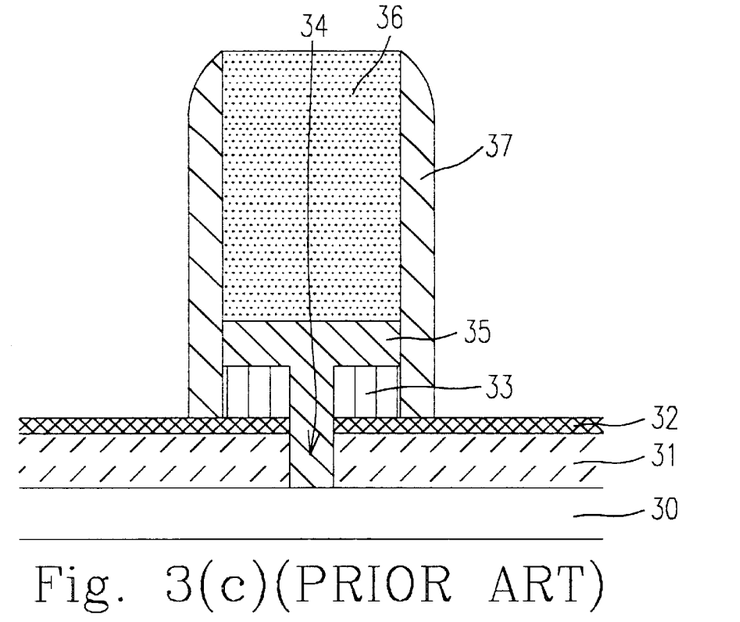

In FIG. 3(c), the second doped polysilicon layer 37 is etched by dry etching (i.e. an anisotropic etching) to expose the top surface of the second sacrificial oxide 36 and a portion of the silicon nitride 32.

Figure 3D:
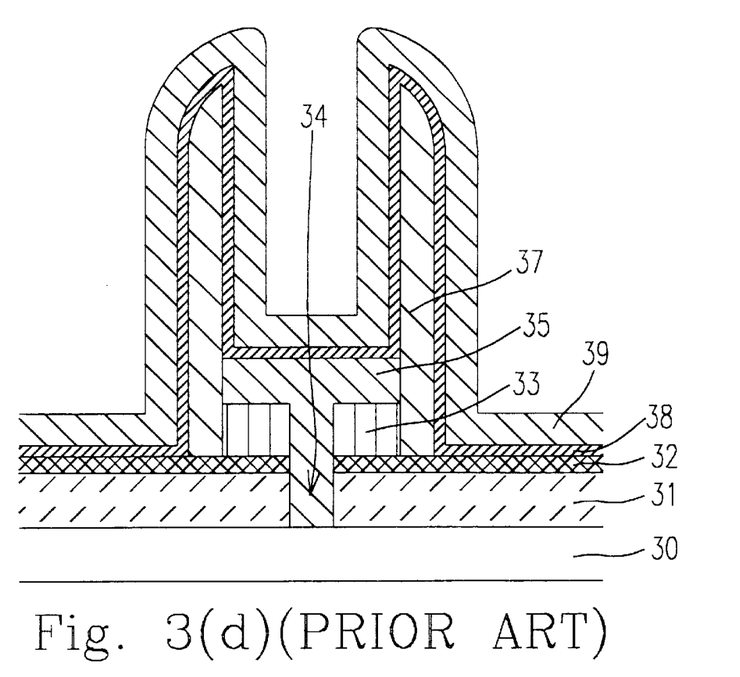

In FIG. 3(d), the second sacrificial oxide 36 is completely removed by using a buffer oxide etchant (B.O.E.) containing hydrofluoric acid (HF) to expose the first doped polysilicon layer 35. Thereafter, an oxide-on-nitride-on-oxide (ONO) layer 38 is formed over the portion of the silicon nitride 32, the second doped polysilicon layer 37, and the first doped polysilicon layer 35 by LPCVD. Finally, another doped polysilicon layer 39 is formed on the ONO layer 38 to construct the capacitor.

However, these conventional methods have some defects described as follows:

1. In FIGS. 1(a) and (b), the rugged polysilicon layer in the fixed capacitor region can not effectively increase the surface area of the capacitor. Therefore, the maximum capacity can be only increased up to two times by such a method using the rugged polysilicon layer for increasing the surface area of capacitor. Because the size of the capacitor will be getting smaller in the future, this method may be no longer effective then.
2. In the method of FIGS. 2(a) and (b), the sacrificial oxide is formed and then is etched for increasing the surface area of the capacitor, but the effect is not good enough for the future requirements.
3. In the method as shown in FIGS. 3(a)~(d), the cylindrical doped polysilicon can increase the surface area of the capacitor which is constructed by a doped polysilicon layer, the ONO layer, and another doped polysilicon layer. Such a structure can increase the total surface area effectively and also provide the solution in the requirements of capacitance below 0.18 um generation of DRAM area. However, it can be seen from FIG. 3(d) that the surface of the capacitor is so irregular that it will seriously influence the subsequent planarization process of the semiconductor.

SUMMARY OF THE INVENTION

An object of the present invention is to provide a manufacturing method which can effectively increase the density and intensity of the capacitor applied to the memory unit with high density.

Another object of the present invention is to provide a structure and a manufacturing method for promoting the yield rate of a capacitor.

In the preferred embodiment of the present invention, the method for manufacturing a capacitor, applied to a memory unit including a substrate forming thereon a dielectric layer forming thereon an etching stop layer, includes the steps of a) forming a sacrificial layer over the etching stop layer, b) partially removing the sacrificial layer, the etching stop layer, and the dielectric layer to form a contact window, c) forming a first conducting layer over the sacrificial layer and in the contact window, d) partially removing the first conducting layer and the sacrificial layer to expose a portion of the sacrificial layer and retain a portion of the first conducting layer, e) forming a second conducting layer over tops and sidewalls of the portion of the first conducting layer and the portion of the sacrificial layer, f) forming an intermediate layer with a rugged structure on said second conducting layer; g) removing said intermediate layer with said rugged structure and partially removing said second conducting layer while retaining a portion of said second conducting layer alongside said portion of said first conducting layer and transferring said rugged structure of said intermediate layer to a rough top surface on said portion of the first conducting layer, thereby exposing said portion of said sacrificial layer; and h) removing said portion of said sacrificial layer to expose said etching stop layer, wherein said portions of said first and second conducting layers with said rough top surface serve as a capacitor plate.

In accordance with one aspect of the present invention, the dielectric layer is formed by a chemical vapor deposition (CVD).

In accordance with another aspect of the present invention, the dielectric layer is a nondoped silicon glass (NSG) layer with a thickness ranging between 1000 Å and 3000 Å.

In accordance with another aspect of the present invention, the etching stop layer is formed by a chemical vapor deposition. The etching stop layer is a silicon nitride layer with a thickness ranging between 100 Å and 300 Å.

In accordance with another aspect of the present invention, in the step (a), the sacrificial layer is formed by a chemical vapor deposition. Preferably, the sacrificial layer is a sacrificial oxide with a thickness more than 6000 Å.

In accordance with another aspect of the present invention, in the step (b), the contact window is formed by a photolithographic and etching technique.

In accordance with another aspect of the present invention, in the step (c), the first conducting layer is formed by a chemical vapor deposition. Preferably, the first conducting layer can be a doped polysilicon layer or a doped amorphous silicon layer, and has a thickness ranging between 1000 Å and 3000 Å.

In accordance with another aspect of the present invention, in the step (d), the first conducting layer and the sacrificial layer are partially removed by a photolithographic and etching technique.

In accordance with another aspect of the present invention, in the step (e), the second conducting layer is formed by a chemical vapor deposition. Preferably, the second conducting layer can be a doped polysilicon layer or a doped amorphous silicon layer, and has a thickness ranging between 1000 Å and 3000 Å.

In accordance with another aspect of the present invention, in the step (f), the intermediate layer is a rugged polysilicon layer formed by a low pressure chemical vapor deposition (LPCVD) under a temperature ranging between 560° C. and 580° C. The step (f) further includes a step to perform a treatment of phosphoric acid for enhancing a rough surface of the intermediate layer.

This method further includes a step after the step (f) to execute an ion implantation on the intermediate layer by using one of arsenic (As) and phosphorus (P).

In accordance with another aspect of the present invention, in the step (g), the intermediate layer and the second conducting layer are removed by an anisotropic etching.

In accordance with another aspect of the present invention, in the step (g), the portion of the sacrificial layer is removed by a wet etching using a buffer oxide etchant (B.O.E.) solution containing hydrofluoric acid (HF).

After the step (h), this method further includes the steps of forming an additional dielectric layer over the etching stop layer, the first conducting layer, and the second conducting layer, and forming a third conducting layer over the additional dielectric layer to serve as another capacitor plate.

In accordance with another aspect of the present invention, the additional dielectric layer and the third conducting layer are formed by a low pressure chemical vapor deposition (LPCVD).

In accordance with another aspect of the present invention, the additional dielectric layer is an oxide-on-nitride-on-oxide (ONO) layer with a thickness ranging between 50 Å and 200 Å.

In accordance with another aspect of the present invention, the third conducting layer is a doped polysilicon layer.

According to the present invention, the capacitor includes a structure formed in the dielectric layer and the etching stop layer and forming a contact window, and a conducting layer filling in the contact window and upwardly extended to form a generally reversed cylindrical structure with a rough top surface, including a horizontal part and a vertical part where the horizontal part has an end thereof extended and the space between the horizontal part and the etching stop layer are adapted to be occupied by a dielectric layer and a conducting layer, to serve as a capacitor plate.

In addition, the capacitor further includes an additional dielectric layer formed over the conducting layer, and an additional conducting layer formed over the additional dielectric layer to serve as another capacitor plate.

The present invention may best be understood through the following description with reference to the accompanying drawings, in which:

DETAILED DESCRIPTION OF THE PREFERRED EMBODIMENT

The preferred embodiment of the method for manufacturing a capacitor according to the present invention is shown in FIGS. 4(a)~(h). The details are described as follows.

Figure 4A:
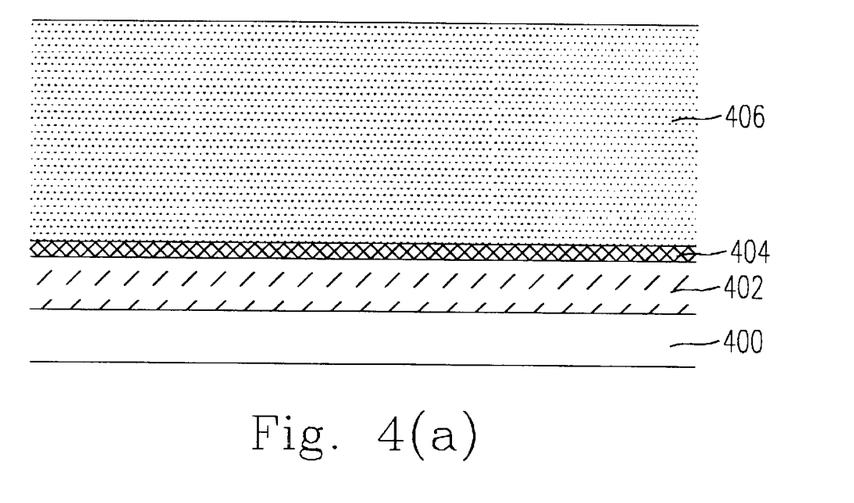
FIGS. 4(a)~(h) are schematic diagrams showing a preferred embodiment of a method for manufacturing a capacitor according to the present invention.

In FIG. 4(a), an interlayer dielectric (ILD) 402 is formed over a substrate 400 by plasma enhanced chemical vapor deposition (PECVD) or lower pressure chemical vapor deposition (LPCVD). The ILD 402 can be a nondoped silicon glass (NSG) layer with a thickness ranging between 1000 Å and 3000 Å. Thereafter, an etching stop layer 404 is formed on the ILD 402 by chemical vapor deposition. Preferably, the etching stop layer 404 is a silicon nitride with a thickness ranging between 100 Å and 300 Å. A sacrificial layer 406 is then formed on the etching stop layer 404 by chemical vapor deposition. Preferably, the sacrificial layer 406 is a sacrificial oxide having a thickness of more than 6000 Å, preferably 8000 Å.

Figure 4B:
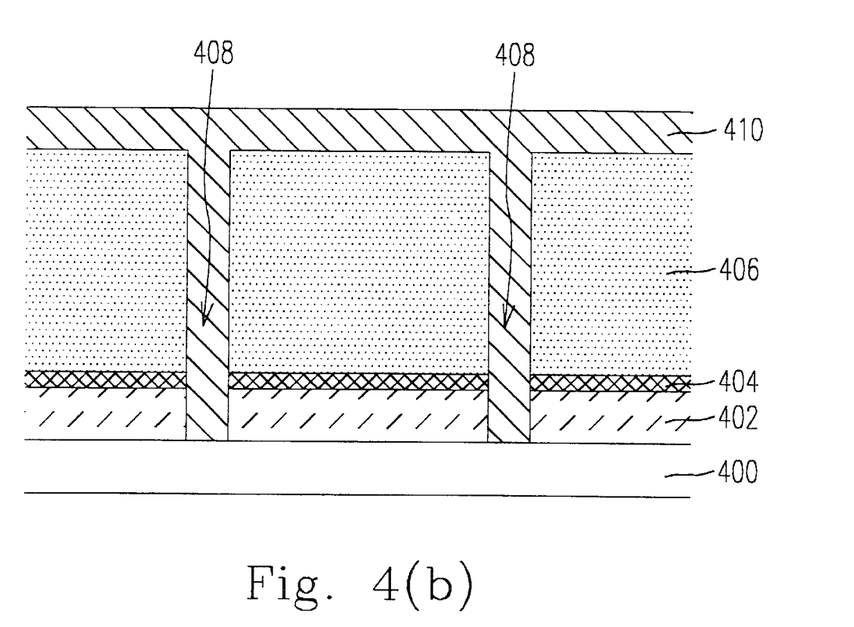

As shown in FIG. 4(b), the sacrificial oxide 406, the etching stop layer 404, and the ILD layer 402 are partially removed to form a contact window 408 by photolithography and etching process. Thereafter, a first conducting layer 410 is formed over the sacrificial layer 406 and is filled in the contact window 408 by low pressure chemical vapor deposition. Preferably, the first conducting layer 410 is a doped polysilicon layer or a doped amorphous silicon layer and has a thickness ranging between 1000 Å and 3000 Å, preferably 2000 Å.

Figure 4C:
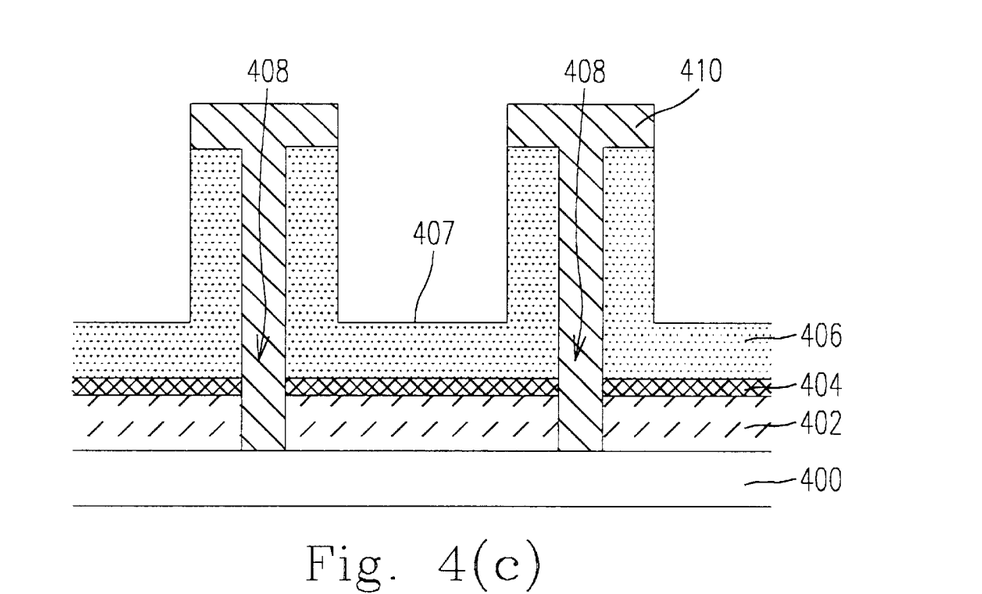

In FIG. 4(c), the first conducting layer 410 and the sacrificial oxide 406 are partially removed by photolithography and etching process to expose a portion of the sacrificial oxide 407.

Figure 4D:
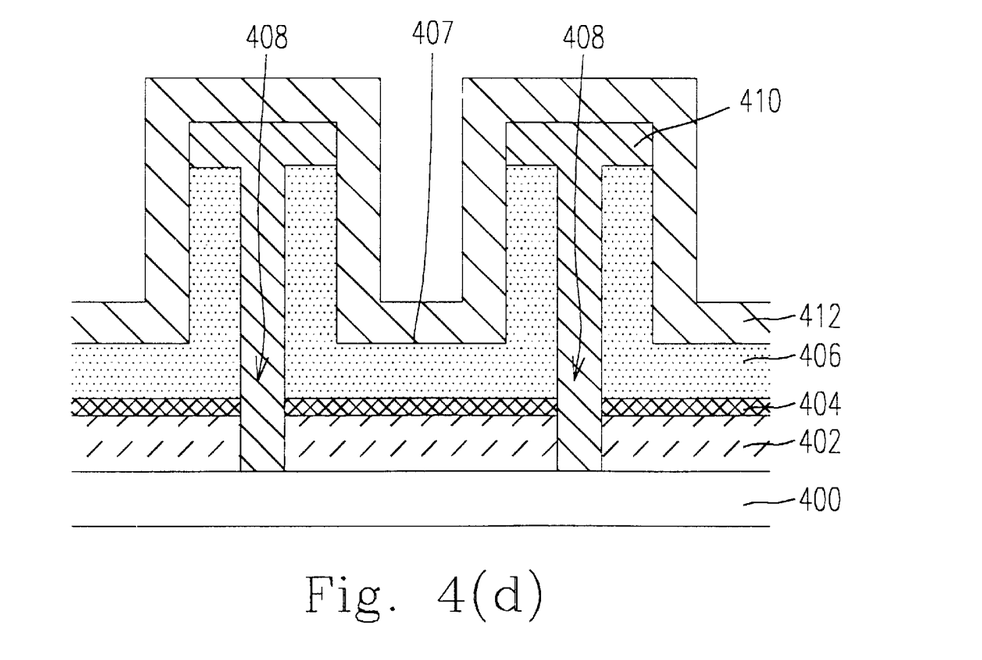

In FIG. 4(d), a second conducting layer 412 is formed over top surfaces and sidewalls of the portion of the first conducting layer 410, and the portion of the sacrificial oxide 407 by chemical vapor deposition. The second conducting layer 412 is preferably a doped polysilicon layer or a doped amorphous silicon layer and has a thickness ranging between 1000 Å and 3000 Å, preferably 2000 Å.

Figure 4E:
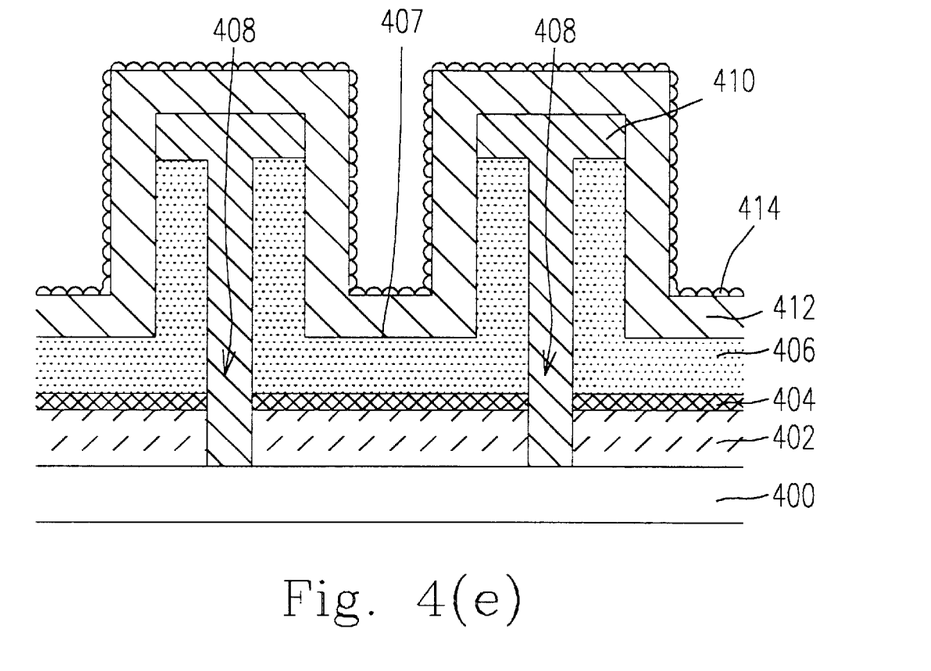

Thereafter, an intermediate layer 414 is formed over the second conducting layer 412 by low pressure chemical vapor deposition (LPCVD) under a temperature ranging between 560° C. and 580° C., as shown in FIG. 4(e). The intermediate layer 414 is preferably a rugged polysilicon layer 414. After the formation of the rugged polysilicon layer 414, it is treated by phosphoric acid to enhance a rough surface of the rugged polysilicon layer 414 for increasing the effective surface area of the capacitor. Then, the rugged polysilicon layer 414 is doped with arsenic (As) or phosphorus (P).

Figure 4F:
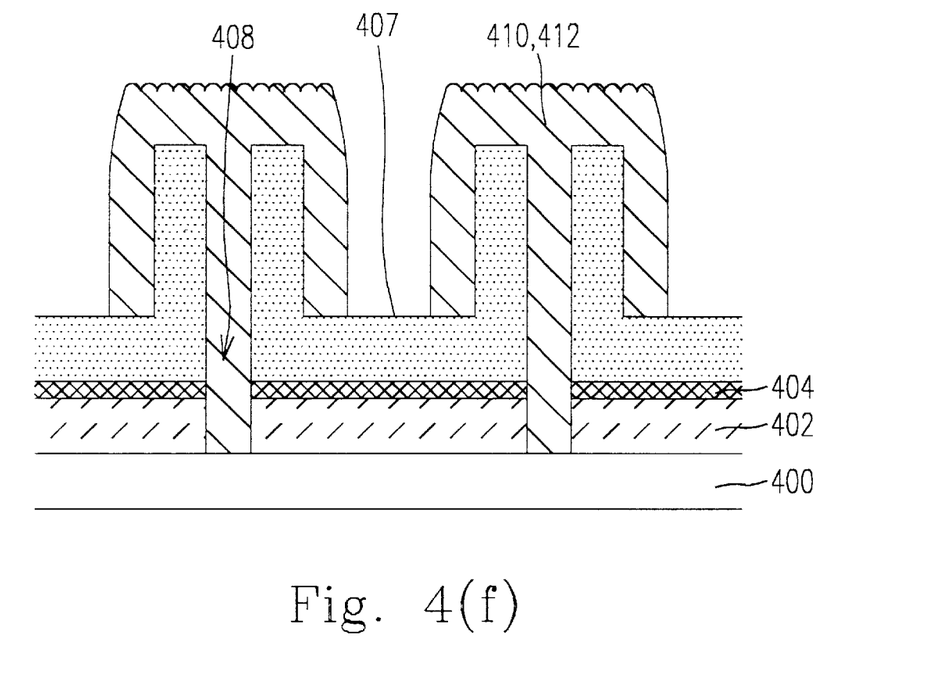
Figure 4G:
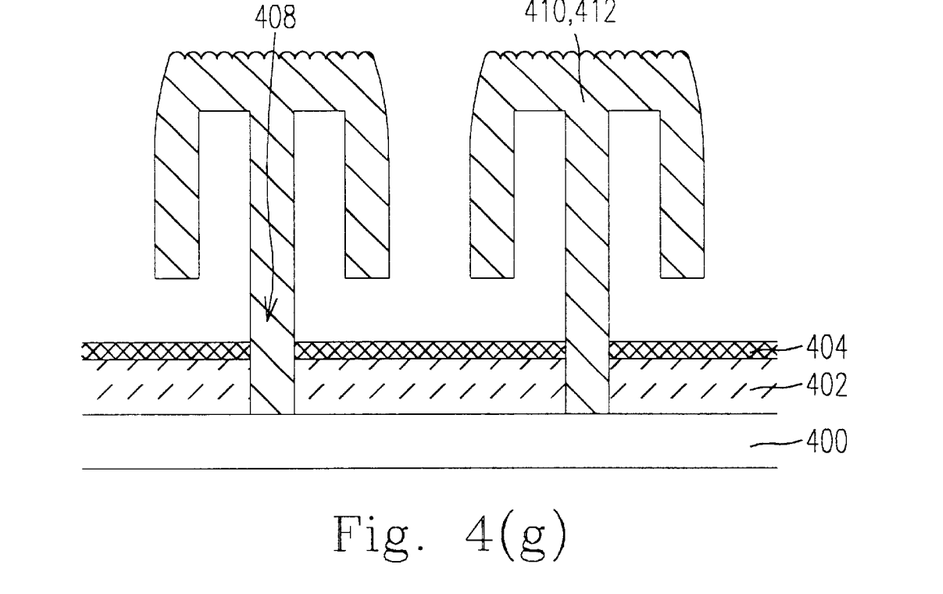

Thereafter, the rugged polysilicon layer 414 is removed and the second conducting layer 412 is partially removed by an anisotropic etching, such as a dry etching, to form a sidewall structure so that the rugged surface of the intermediate layer is transferred to a rough top surface on the first conducting layer simultaneously while retaining a portion of the second conducting layer alongside the portion of the first conducting layer 410, thereby exposing the portion of the sacrificial oxide 407, as shown in FIG. 4(f). Because the first conducting layer 410 and the second conducting layer 412 are preferably formed of the same material, doped polysilicon, the anisotropic etching possesses the inherent function of etching downwards through the second conducting layer at the same rate across the rugged surface of the second conducting layer, thus retaining the rugged surface as the etch proceeds and transferring the rugged surface from the intermediate layer to the first conducting layer. Furthermore, if the first conducting layer and the second conducting layer are formed of the same material (e.g. doped polysilicon or doped amorphous silicon), both of them will be combined together. On the other hand, the rugged structure on the sidewall of the retained second conducting layer 412 will be removed in the long-time etching step due to a native oxide (not shown) naturally formed between the second conducting layer 412 and the intermediate layer 414 during the formation of the intermediate layer to finally obtain the structure 410, 412 as shown in FIG. 4(f). Then, the sacrificial oxide 406 is removed by a wet etching to expose the etching stop layer 404 as shown in FIG. 4(g). The wet etching can use a buffer oxide etchant (B.O.E.) containing hydrofluoric acid (HF). The portion of the first conducting layer 410 and the portion of the second conducting layer 412 with the rough top surface serve as the first capacitor plate (i.e. a lower capacitor plate).

Figure 4H:
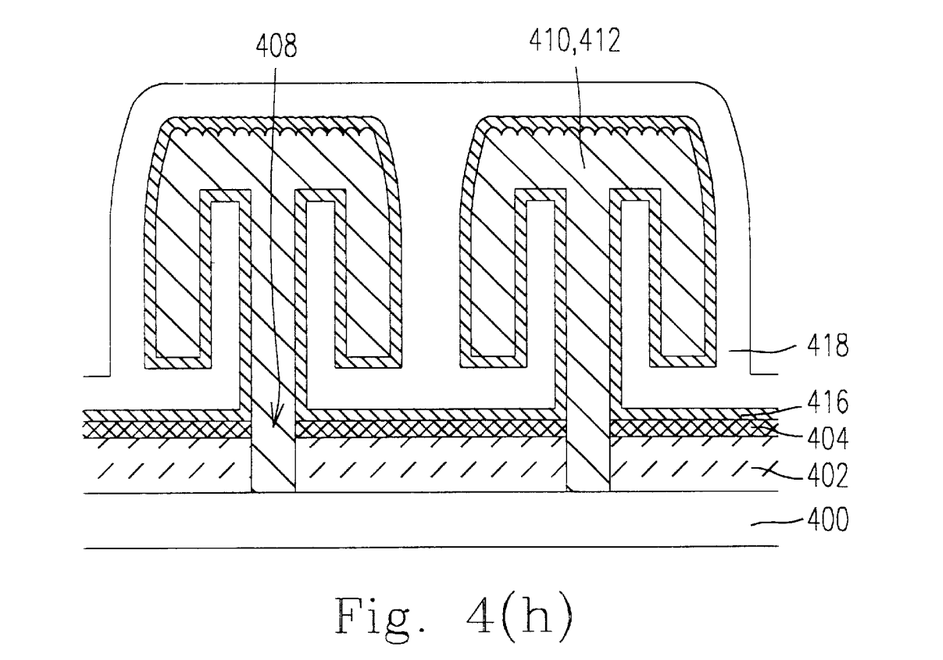

Certainly, the manufacturing method further includes other steps to obtain a complete capacitor after performing the preceding steps. As shown in FIG. 4(h), the steps include: (1) forming an additional dielectric layer 416 over the etching stop layer 404, the portions of the first conducting layer and the second conducting layer 410, 412 with the rough top surface; and (2) forming a third conducting layer 418 over the additional dielectric layer 416. The additional dielectric layer 416 and the third conducting layer 418 are formed by a low pressure chemical vapor deposition (LPCVD). The additional dielectric layer 416 is preferably an oxide-on-nitride-on-oxide (ONO) layer with a thickness ranging between 50 Å and 200 Å. Preferably, the third conducting layer 418 is a doped polysilicon layer. The additional dielectric layer 416 and the third conducting layer 418 serve as the second capacitor plate (or an upper capacitor plate). Finally, the preferred embodiment of the capacitor according to the present invention is fabricated.

The concept of the present invention comes from cylindrical shaped capacitor which is widely used for the production no matter in DRAM related area or fundrary fab. The cylindrical capacitor can increase the capacitor area effectively and provide sufficient capacitance for the future generation, below 0.18 um generation. The structure of the present invention is a reversed shape of cylindrical capacitor which can not only provide more effective area from the extra plug surface inside the cylindrical structure, but also provide a more planarized top surface for the following processing.

According to the present invention, the method for manufacturing the capacitor is not only very simple but can effectively increase the surface area of the capacitor. More particularly, this method will construct a special capacitor structure. As shown in FIG. 4(g), an interlayer dielectric 402 and an etching stop layer 404, both of which are formed on a silicon substrate 400 in sequence, are partially removed for forming a contact window 408. There is a conducting layer (including the first conducting layer and the second conducting layer 410, 412 with a rough top surface) filling in the contact window 408 and upwardly extended to form a generally reversed cylindrical structure with a rough top surface, including a horizontal part and a vertical part where the horizontal part has an end thereof extended and the space between the horizontal part and the etching stop layer are adapted to be occupied by a dielectric layer and a conducting layer. The conducting layers 410, 412 serve as a lower capacitor plate. Furthermore, the conducting layers 410, 412 with a rough top surface can also contribute to an increase in the surface area of the capacitor.

To sum up, a generally reversed cylindrical structure with the rough top surface, formed by the first and second conducting layers 410, 412 according to the present invention, not only increases the surface area but is conducive to the subsequent planarization process. Therefore, merely with a simple process, it can significantly increase the surface area of the capacitor in comparison with the preceding conventional capacitors. Certainly, the height of the sacrificial oxide and the etching depth can be optionally adjusted according to the desired capacity. Therefore, the method of the present invention provides a unique capacitor structure which can prevent the defects caused by the prior art and solve the problem of the insufficient capacity in the certain capacitor region.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a capacitor applied to a memory unit including a substrate forming thereon a dielectric layer forming thereon an etching stop layer, comprising steps of:
   a) forming a sacrificial layer over said etching stop layer;
   b) partially removing said sacrificial layer, said etching stop layer, and said dielectric layer to form a contact window;
   c) forming a first conducting layer over said sacrificial layer and in said contact window;
   d) partially removing said first conducting layer and said sacrificial layer to expose a portion of said sacrificial layer and retain a portion of said first conducting layer;
   e) forming a second conducting layer over tops and sidewalls of said portion of said first conducting layer and said portion of said sacrificial layer;
   f) forming an intermediate layer with a rugged structure on said second conducting layer;
   g) removing said intermediate layer with said rugged structure and partially removing said second conducting layer while retaining a portion of said second conducting layer alongside said portion of said first conducting layer and transferring said rugged structure of said intermediate layer to a rough top surface on said portion of the first conducting layer, thereby exposing said portion of said sacrificial layer; and
   h) removing said portion of said sacrificial layer to expose said etching stop layer, wherein said portions of said first and second conducting layers with said rough top surface serve as a capacitor plate.

2. A method according to claim 1 wherein said dielectric layer is formed by a chemical vapor deposition (CVD).

3. A method according to claim 1 wherein said dielectric layer is a nondoped silicon glass (NSG) layer with a thickness ranging between 1000 Å and 3000 Å.

4. A method according to claim 1 wherein said etching stop layer is formed by a chemical vapor deposition.

5. A method according to claim 1 wherein said etching stop layer is a silicon nitride layer with a thickness ranging between 100 Å and 300 Å.

6. A method according to claim 1 wherein in said step (a), said sacrificial layer is formed by a chemical vapor deposition.

7. A method according to claim 1 wherein said sacrificial layer is a sacrificial oxide with a thickness more than 6000 Å.

8. A method according to claim 1 wherein in said step (b), said contact window is formed by a photolithographic and etching technique.

9. A method according to claim 1 wherein in said step (c), said first conducting layer is formed by a chemical vapor deposition.

10. A method according to claim 1 wherein said first conducting layer is one of a doped polysilicon layer and a doped amorphous silicon layer, and has a thickness ranging between 1000 Å and 3000 Å.

11. A method according to claim 1 wherein in said step (d), said first conducting layer and said sacrificial layer are partially removed by a photolithographic and etching technique.

12. A method according to claim 1 wherein in said step (e), said second conducting layer is formed by a chemical vapor deposition.

13. A method according to claim 1 wherein said second conducting layer is one of a doped polysilicon layer and a doped amorphous silicon layer, and has a thickness ranging between 1000 Å and 3000 Å.

14. A method according to claim 1 wherein in said step (f), said intermediate layer is a rugged polysilicon layer formed by a low pressure chemical vapor deposition (LPCVD) under a temperature ranging between 560° C. and 580° C.

15. A method according to claim 1 wherein said step (f) further comprises a step to perform a treatment of phosphoric acid for enhancing a rough surface of said intermediate layer.

16. A method according to claim 1 further comprising a step after said step (f) to execute an ion implantation on said intermediate layer by using one of arsenic(As) and phosphorus (P).

17. A method according to claim 1 wherein in said step (g), said intermediate layer and said second conducting layer are removed by an anisotropic etching.

18. A method according to claim 1 wherein in said step (g), said portion of said sacrificial layer is removed by a wet etching using a buffer oxide etchant (B.O.E.) containing hydrofluoric acid (HF).

19. A method according to claim 1 further comprising steps after said step (h):
   i) forming an additional dielectric layer over said etching stop layer, said first conducting layer, and said second conducting layer; and
   j) forming a third conducting layer over said additional dielectric layer to serve as an another capacitor plate.

20. A method according to claim 19 wherein said additional dielectric layer and said third conducting layer are formed by a low pressure chemical vapor deposition (LPCVD).

21. A method according to claim 19 wherein said additional dielectric layer is an oxide-on-nitride-on-oxide (ONO) layer with a thickness ranging between 50 Å and 200 Å.

22. A method according to claim 19 wherein said third conducting layer is a doped polysilicon layer.

* * * * *